United States Patent [19]

Gottesfeld et al.

[11] Patent Number: 5,368,717

[45] Date of Patent: Nov. 29, 1994

[54] METALLIZATION OF ELECTRONIC INSULATORS

[75] Inventors: Shimshon Gottesfeld; Francisco A. Uribe, both of Los Alamos, N. Mex.

[73] Assignee: The Regents of the University of California, Office of Technology Transfer, Alameda, Calif.

[21] Appl. No.: 32,959

[22] Filed: Mar. 17, 1993

Related U.S. Application Data

[63] Continuation-in-part of Ser. No. 617,757, Nov. 26, 1990.

[51] Int. Cl.$^5$ ............................................. C25D 5/56
[52] U.S. Cl. ........................................ 205/98; 205/166
[58] Field of Search ............. 205/126, 166, 183, 925, 205/98; 427/443.1

[56] References Cited

U.S. PATENT DOCUMENTS

| | | | |
|---|---|---|---|
| 4,617,228 | 10/1986 | Newman et al. | 428/121 |
| 4,803,096 | 2/1989 | Kuhn et al. | 427/121 |
| 4,877,646 | 10/1989 | Kuhn et al. | 427/121 |
| 5,106,473 | 4/1992 | Whitlaw et al. | 205/150 |

FOREIGN PATENT DOCUMENTS

| | | |
|---|---|---|
| 89304262.2 | 1/1990 | European Pat. Off. |
| 63-125696 | 5/1988 | Japan . |
| 89/00204 | 9/1989 | WIPO . |

OTHER PUBLICATIONS

Frederick A. Lowenheim, *Electroplating*, Chapter 19 "Plating on Nonconductors", pp. 416–417 (McGraw-Hill Book Company 1978).

G. D. Chandler et al., "The Electrodeposition Of Metals Onto Polypyrrole Films From Aqueous Solution," 16 J. Appl. Electrochem., pp. 62–68 (1986).

*Primary Examiner*—John Niebling
*Assistant Examiner*—Brendan Mee
*Attorney, Agent, or Firm*—Ray G. Wilson

[57] ABSTRACT

An electroplated element is formed to include an insulating substrate, a conducting polymer polymerized in situ on the substrate, and a metal layer deposited on the conducting polymer. In one application a circuit board is formed by polymerizing pyrrole on an epoxy-fiberglass substrate in a single step process and then electrodepositing a metal over the resulting polypyrrole polymer. No chemical deposition of the metal is required prior to electroplating and the resulting layer of substrate-polymer-metal has excellent adhesion characteristics. The metal deposition is surprisingly smooth and uniform over the relatively high resistance film of polypyrrole. A continuous manufacturing process is obtained by filtering the solution between successive substrates to remove polymer formed in the solution, by maintaining the solution oxidizing potential within selected limits, and by adding a strong oxidant, such as $KMnO_4$ at periodic intervals to maintain a low sheet resistivity in the resulting conducting polymer film.

10 Claims, 5 Drawing Sheets

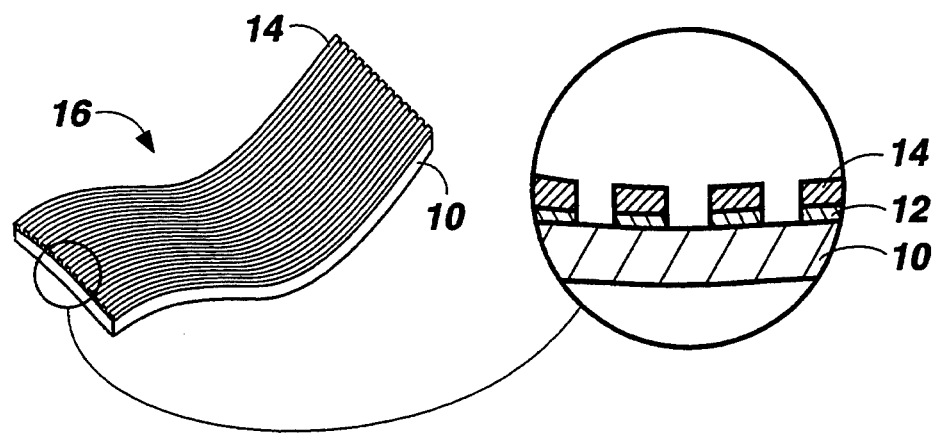
FIG. 5A  FIG. 5B
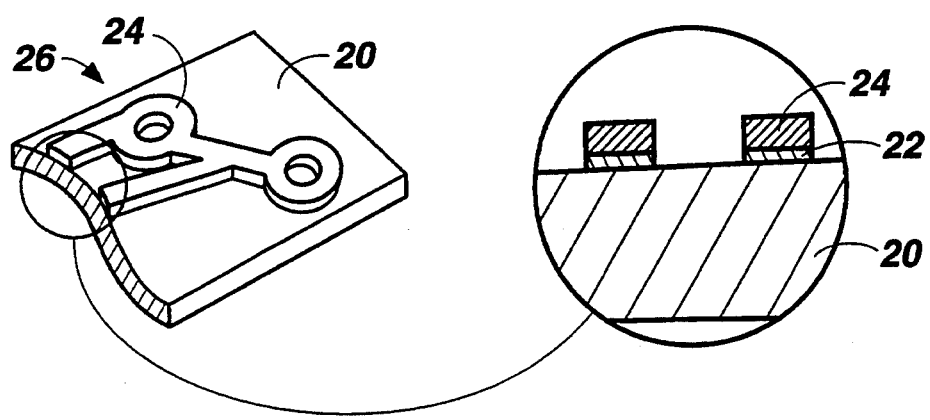
FIG. 6A  FIG. 6B

METALLIZATION OF ELECTRONIC INSULATORS

RELATED CASE

This patent application is a continuation-in-part of U.S. patent application Ser. No. 07/617,757, filed Nov. 26, 1990.

BACKGROUND OF INVENTION

This invention relates to the metallization of insulating substrates, and, more particularly, to the electrodeposition of conducting coatings on insulating substrates. This invention is the result of a contract with the Department of Energy (Contract No. W-7405-ENG-36).

There are many electronic applications that require the metallization of insulating, i.e., nonconducting substrates, e.g., shielded enclosures, thin film conductors, printed circuit boards, VLSI circuits, etc. Conventional electroplating processes can not be initiated on insulating substrates since these processes require the presence of a conductive substrate surface. Accordingly, electroless processes are used to deposit at least an initial film of conductive material and the resulting film serves as a substrate for subsequent electroplating.

Conventional electroless deposition uses a chemical process for forming a metal on an insulating substrate. The chemical processes generally require the use of environmentally and physically hazardous chemicals, such as formaldehyde, and the use of precious metals, such as palladium, as a catalyst for the chemical reaction. Such processes are in widespread use in the production of circuit boards for use in electronic components.

An alternate process is described in PCT Application No. PCT/EP89/00204, Publication No. WO89/08375, published Sep. 8, 1989. Conducting polymers are applied to the substrate in various processes wherein a monomer is applied to a substrate and thereafter oxidized to form a conducting polymer. A metal is then electrodeposited over the conducting polymer. However, this and other related processes use a multi-step process to form the conducting layer whereby the underlying substrate is moved from one chemical bath to another to complete the polymerization process.

To provide an attractive alternative to conventional electroless metal deposition, a conducting-polymer-based process should (a) not involve hazardous chemicals, (b) use a simple polymer coating process, (c) provide a polymer film with sufficient conductivity for subsequent metal electrodeposition, (d) provide adequate peel strength for the deposited metal, (e) enable through-hole plating, and (f) use inexpensive chemicals. A suitable commercial process would also be continuous and have a minimum number of process steps. These concerns are addressed by the present invention wherein a conductive-polymer-based process includes a single step, continuous process for forming the polymer that is readily adaptable to a manufacturing operation.

Accordingly, it is an object of the present invention to electroplate insulating substrates in a manufacturing process without forming a precursor metal film by a chemical process.

It is another object of the present invention to form a conducting polymer onto an insulating substrate in a single bath.

It is yet another object of the present invention to electroplate a metal onto a substrate coated with a conducting polymer.

Yet another object of the present invention is to provide a generally continuous process for forming films of conducting polymer precoats for use in a metal electrodeposition process.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF INVENTION

To achieve the foregoing and other objects, and in accordance with the purposes of the present invention, as embodied and broadly described herein, the process of this invention may comprise plating onto an insulating substrate. A solution is formed comprising a monomer, a relatively weak oxidant for the monomer effective to provide a solution potential within predetermined limits, and a dopant. The insulating substrate is immersed in the solution for a time effective to form a conducting polymer having a sheet resistivity effective for electrodeposition of a selected metal. The selected metal is then electrodeposited on to the substrate coated with the conducting polymer.

In another characterization of the invention, a plurality of insulating substrates are electroplated with a conducting metal. An initial solution is formed comprising a monomer, a relatively weak oxidant for the monomer effective to provide a solution potential within predetermined limits, and a dopant. Successive substrates are immersed in the solution for a time effective to form a conducting polymer having a sheet resistivity effective for electrodeposition of a selected metal. The selected metal is electrodeposited onto each substrate that is coated with the conducting polymer. The solution is filtered between successive ones of the substrates to remove conducting polymer formed in the solution. The solution potential is maintained within predetermined limits to minimize the sheet resistivity of conducting polymer film formed on the substrate.

In yet another characterization of the invention, a conductive polymer surface is formed on successive substrates in a continuous process. An initial solution is formed comprising a monomer, a relatively weak oxidant for the monomer effective to provide a solution potential within predetermined limits, and a dopant. Successive substrates are immersed in the solution for a time effective to form a conducting polymer having a sheet resistivity within selected limits. The solution is filtered between successive substrates to remove conducting polymer formed in the solution. The solution potential is maintained within predetermined limits to minimize the sheet resistivity of conducting polymer formed on the substrate.

In one aspect of the invention, a solution is provided to produce a conducting polymer surface on an insulating substrate. The solution comprises a monomer, a relatively weak oxidant for the monomer effective to provide a solution potential within predetermined limits, and a dopant.

BRIEF DESCRIPTION OF THE DRAWINGS

The accompanying drawings, which are incorporated in and form a part of the specification, illustrate the present invention and, together with the description, serve to explain the principles of the invention. In the drawings:

FIGS. 5A and 5B pictorially illustrate a first possible component formed by depositing a conducting metal on a conducting polymer formed on an insulating substrate.

FIGS. 6A and 6B pictorially illustrate a second possible component formed by depositing a conducting metal on a conducting polymer formed on an insulating substrate.

DETAILED DESCRIPTION OF THE INVENTION

Figure 1:
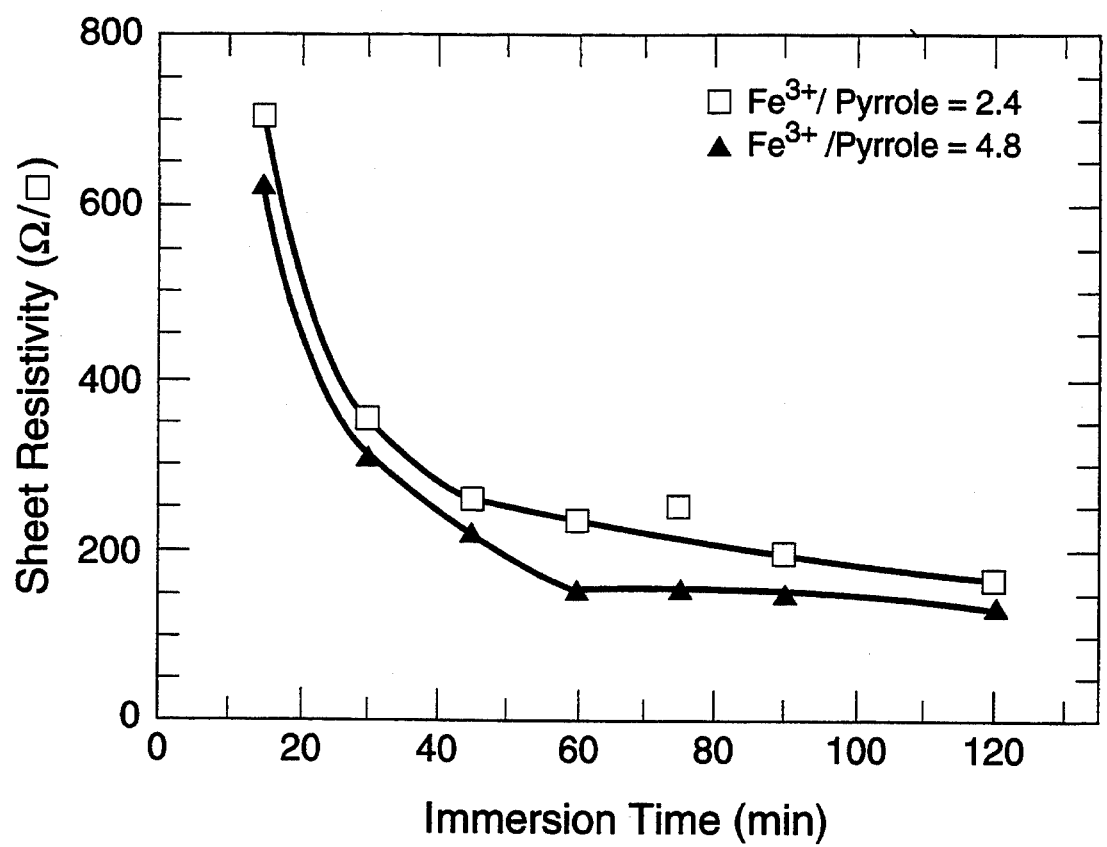
FIG. 1 graphically illustrates the sheet resistivity of a conducting polymer film as a function of substrate immersion time in solutions with two different oxidant/monomer ratios.

A metal coat is formed on an insulating substrate by forming a first conducting polymer layer on the substrate and thereafter depositing the selected metal onto the conducting polymer. The resulting composite electronic component may be used to form a shielded enclosure, formed into a printed circuit, formed into a flexible electrical cable or other flexible electronic circuit, etc.

It is known to form conducting polymers on insulating substrates. For example, U.S. Pat. Nos. 4,803,096, issued Feb. 7, 1989, to Kuhn et al., and 4,877,646, issued Oct. 31, 1989, to Kuhn et al., incorporated herein by reference, teach making fabrics electrically conductive by forming polypyrrole or polyaniline polymers on the fabric, or individual fibers that are woven into fabric. The processes described in the Kuhn patents are generally adapted in the present invention to forming conductive compounds such as polypyrrole on continuous substrates of insulating materials. As shown in the examples below, and in accordance with the present invention, polypyrrole layers have been formed on fiberglass/epoxy substrates (circuit board material) and on polyimide membranes (a substrate for a flexible electronic component or a dielectric for a capacitor).

A metal is then electroplated onto the conducting polymer using conventional electroplating baths. Surprisingly, uniform electroplating layers are obtained even with high sheet resistivities of the conducting polymer. Acceptable sheet resistivities are 3 KΩ/square. A sheet resistance of hundreds of ohms is normally considered too high for uniform metal electroplating in a conventional process where the electrical contact must be made to only one edge or a corner of the substrate.

It is observed that a metal film starts to form adjacent the electrical contact point and the film formation then propagates along the polypyrrole surface, adhering well to the surface. After an initial layer of electroplated film has covered the whole surface of the sample, the electroplating process continues uniformly and the metal layer thickens over the whole surface, resulting in uniform final metal coating thicknesses of, for example, 20 micrometers.

Copper, nickel, and gold have been successfully electroplated onto a polypyrrole surface to demonstrate that the process may be generally used with metals that can be electroplated, i.e., most metals. Each of the three metals requires different electroplating parameters, but each was successfully electroplated using conventional electroplating techniques. In all cases, the polypyrrole adhered satisfactorily to the underlying insulating substrate and the metal adhered satisfactorily to the polypyrrole layer, as shown by standard peel strength tests.

In a general description of the process, an insulating substrate is first coated with a film of polypyrrole using a chemical (electroless) process without hazardous chemicals or precious metals. The substrate is first immersed in a polymerizing aqueous solution containing a monomer (e.g., pyrrole); an oxidizing agent (e.g., $FeCl_3$, $NH_4VO_3$) and an additional salt whose anion ($X^-$) acts as a dopant (counterion) of the oxidized form of the conducting polymer. As the reaction proceeds, the monomer undergoes an oxidative polymerization at the substrate surface, which eventually becomes coated with an oxidized polymer film. The solution preparation and the polymer coating reaction are carried out at ambient temperature (about 25° C.).

The net chemical reaction between pyrrole (PY) and $Fe^{3+}$ is

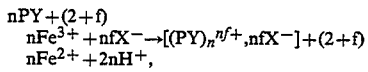

where the term in brackets represents the oxidized doped form of polypyrrole (PPY) and f is about 0.3. This quantity means that in the oxidized PPY there is about one positive charge for every 3 pyrrole units, and one negative anionic charge to maintain the electroneutrality. The conducting polymer film provides enough electronic conductivity to the substrate surface to directly electroplate on the resulting surface.

Exemplary Process

Substrate Preparation: The substrates were simply washed with a detergent, followed by rinsing with deionized water.

PPY Formation: A polymerizing bath was formed with 0.022 M pyrrole, 0.051 M $FeCl_3.6H_2O$; 0.005 M $FeCl_2.4H_2O$; 0.011 M 1,5-naphthalenedisulfonic acid, disodium salt (NDSA-$Na_2$); and water as solvent. The $Fe^{2+}$ is not required for polymerization, but was added to moderate the oxidizing potential of the solution, as discussed below. Comparable conductivities, i.e., a few hundred ohms per square, have also been obtained by adding sulfosalicylic acid (SSA), which forms a stable complex with $Fe^{3+}$ and moderates the rate of polymerization. The anion of the NDSA-$Na_2$ salt is the dopant in the oxidized PPY. Alternative dopants have also been used: tetraethylammonium p-toluene sulfonate; tetramethylammonium hexafluorophosphate; tetraethylammonium hexafluoroborate; 1-hexanesulfonic acid, sodium salt; sodium sulfate and potassium chloride. The pyrrole was purified by filtering it through an active alumina column and stored refrigerated under argon.

Cu Plating Solutions: Generally, conventional acid baths were used for Cu electroplating. A typical bath contained 60 g/liter total Cu, 60 g/liter $H_2SO_4$ and 0.56 ml/liter of brightener (e.g., UBAC, R-1 Udylite). Some solutions contained 0.8 M Cu(II) and 1.6 M SSA. The source of Cu(II) in solutions with SSA was copper carbonate. The PPY coated substrate was mechanically gripped at one edge to establish ohmic contact and immersed in the bath. Nominal current densities of 35 mA/cm² were employed for electroplating.

PPY films chemically coated onto insulating substrates using the above process are well adhered to the substrate and exhibit sheet resistivities on the order of a few hundred ohms per square. These resistivities permit Cu electroplating, although lower resistivities are desirable. As shown in FIG. 1, the sheet resistivity is a function of substrate immersion time in the PPY solution and appears to reach a lower constant value after an immersion time of about one hour. An adherent film thickness of about 0.2–0.3 μm thick film was obtained.

The chemically grown PPY films can be thickened by electrochemical polymerization in aqueous solutions, discussed above. Anodic films have been formed having an average thickness of about 12 μm.

Figure 2:
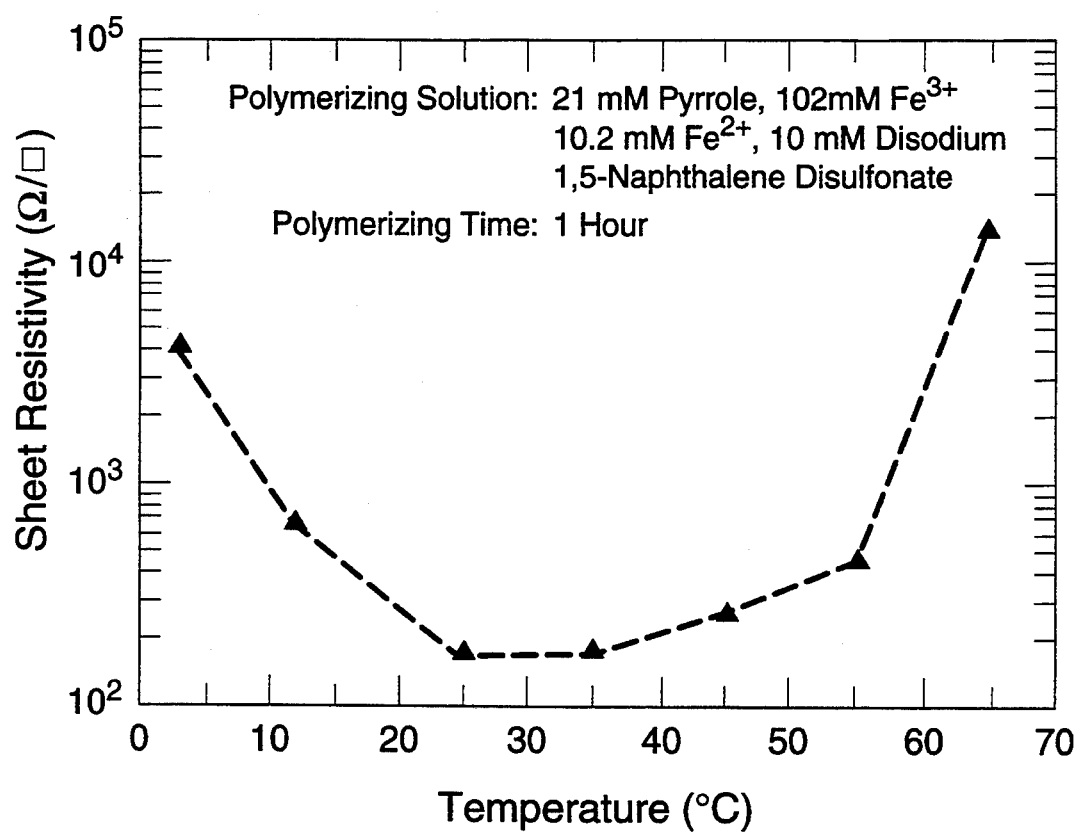
FIG. 2 graphically illustrates the sheet resistivity of a conducting polymer as a function of solution temperature.

The temperature of the bath during the polymerization also has an effect on the film sheet resistivity. As shown in FIG. 2, for a given polymerizing solution and coating time, less resistive films are produced at ambient temperatures. At low temperatures, the polymerization reaction is slow and only very thin films are obtained at a given time. At high temperatures, the reaction occurs preferentially in the bulk solution and less PPY is formed on the substrate.

Another factor that affects the sheet resistivity of PPY films is the activity of the oxidizing agent in the polymerizing solution. Although $FeCl_3$ is a relatively mild oxidizing agent that will not overoxidize polypyrrole, it is found that the PPY resistivity can be minimized by optimizing the oxidizing potential of the solution. The solution potential can be adjusted by the addition of $Fe^{+2}$.

Figure 3:
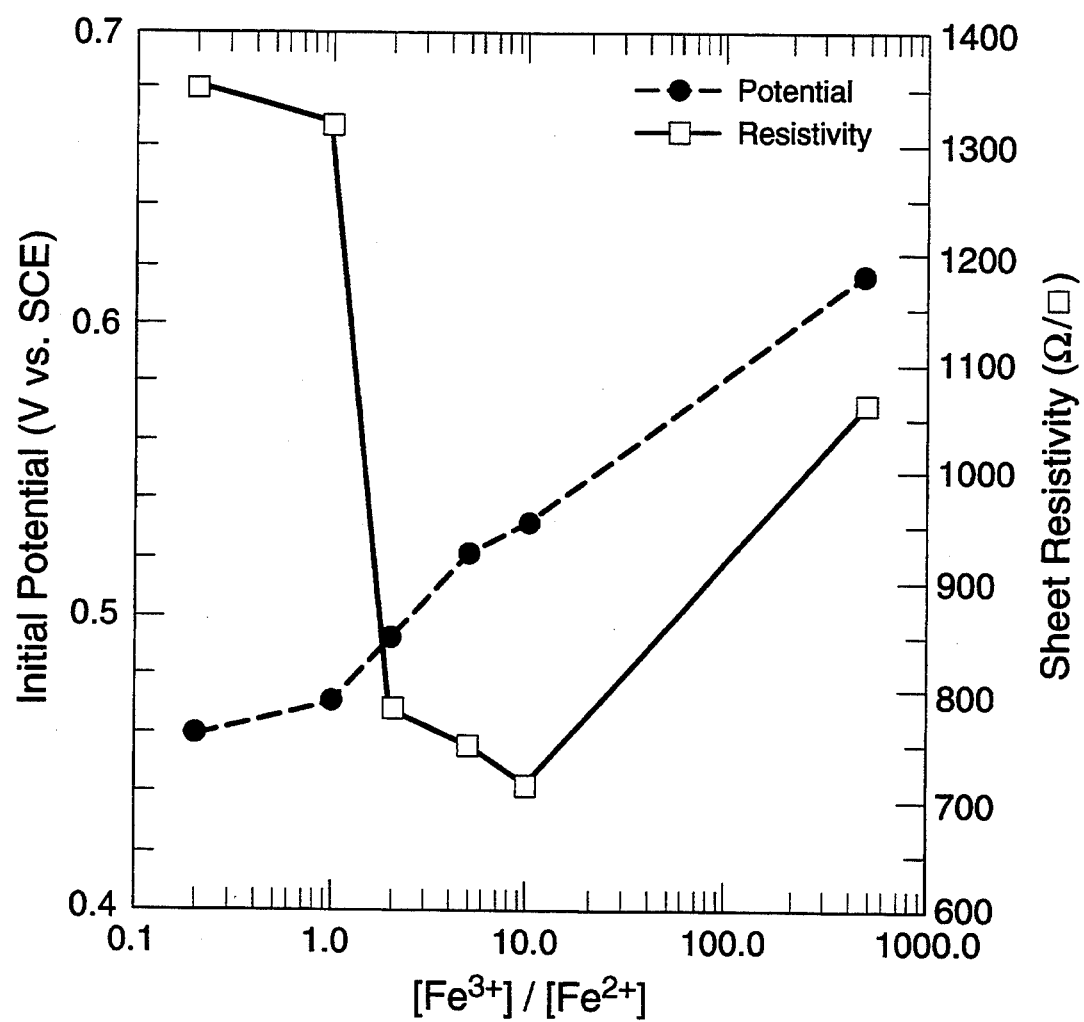
FIG. 3 graphically illustrates conducting polymer sheet resistivity as a function of solution oxidation potential.

The relationship between sheet resistivity and oxidizing potential is shown in FIG. 3 with respect to the initial solution ratio of $[Fe^{3+}]/[Fe^{2+}]$. For equal polymerization times, the most conductive coatings were obtained when this ratio was 10/1 with an initial solution potential of about 0.53 V vs. SCE. This solution potential is about 100 mV lower than the initial potential of a solution containing no added $FeCl_2$.

It is desirable to keep the concentration of reactants to a minimum value consistent with a desired film formation time. While acceptable PPY films are formed at higher reactant concentrations, the polymerization reaction is not surface specific and some of the polymer forms in the bulk solution as well as on the surface to decrease the bath coating efficiency.

In one embodiment of the present invention, a continuous process is provided for coating insulating substrates. Pyrrole and $FeCl_3$ are initially present in a stoichiometric ratio (1:2.3) to produce PPY in its oxidized form. Consequently, pyrrole and $FeCl_3$ must be replenished as substrates are coated. Further, the PPY that forms in the bulk solution provides a large surface area that competes with the substrate surface for deposition of new PPY. Thus, a production sequence of sample coating, filtration, addition of reactants, and new sample coating is required and can be repeated for a number of times, e.g., seven, and maintain adequate sheet resistivities (3 KΩ/square).

Figure 4:
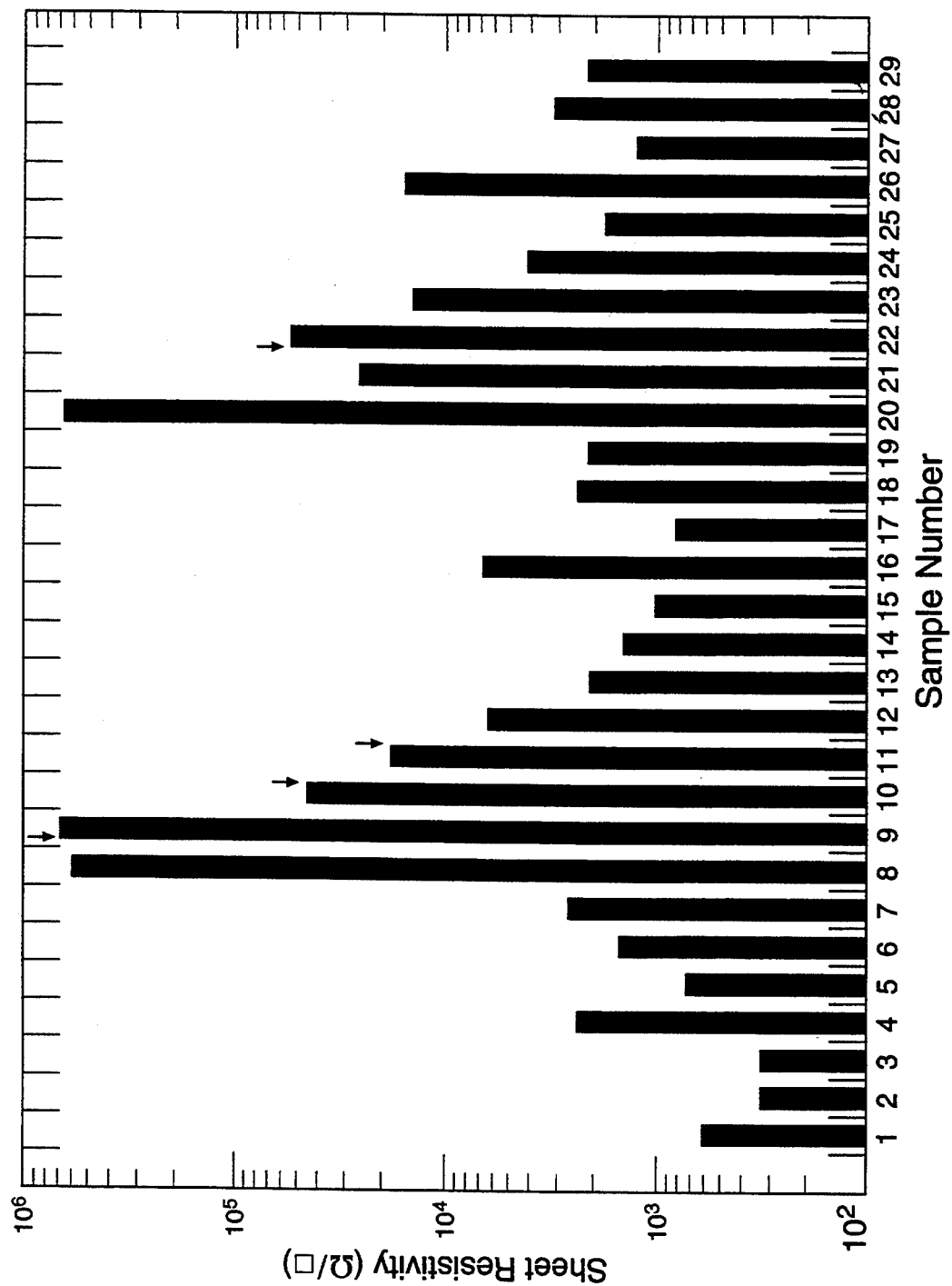
FIG. 4 graphically illustrates the effect on sheet resistivity of the addition of a strong oxidant to a one step polymerizing solution.

FIG. 4 illustrates the production of PPY films using the above sequence. However, after some number of substrates have been processed, the sheet resistivity of the films increases to unacceptable levels. In accordance with the present invention, the sheet resistivity is returned to acceptable levels by the periodic addition of relatively strong oxidizing agent, i.e., $KMnO_4$, to reactivate the solution. The addition of $KMnO_4$ is indicated by the arrows shown on FIG. 4.

Reactivation of the solution is needed to correct for two chemical reactions. First, some of the pyrrole is only oxidized to soluble oligomeric forms that accumulate in the bath. These oligomers oxidize more readily than the monomer and tend to preferentially consume new additions of $FeCl_3$ and produce PPY that does not adhere to the substrate. The strong oxidizing agent acts to oxidize the accumulated oligomers. Further, $Fe^{+2}$ accumulates as the solution is used with new samples, producing a decreasing solution potential that slows the polymerization reaction and results in thin films. As shown in FIG. 4, the addition of $KMnO_4$ after samples 8, 10, 11, and 21 (3, 2, 0.5, and 3.3 ml, respectively, of 0.4M $KMnO_4$) reactivated the solution for continued PPY film production.

The scope of the invention is not limited to polyimide and fiberglass/epoxy substrates. Any insulating material that is useful in electronic components should be applicable. While electroplating has been done with three important metals, copper, nickel, and gold, any metal that can be electroplated is within the scope of the enabled process.

The resulting metallized components have application to electronic components as shown in FIGS. 5A, 5B, 6A and 6B. For one component, a Kapton substrate 10 having an intermediate layer 12 of conducting polymer, i.e., polypyrrole, and coated with a metal 14 might be configured by conventional fabrication methods to form a multiwire flexible lead 16. In another component, a fiberglass/epoxy substrate 20 having an intermediate layer 22 of conducting polymer, i.e., polypyrrole, and coated with a metal 24, is then configured to form printed circuits 26. In one technique the circuit pattern is formed on the substrate by conventional photolithograph techniques before the polymer layer is applied. In another technique, the circuit pattern from the layered product is formed by a physical removal process, e.g., by thermal etching using lasers or oxygen plasma etching.

The foregoing description of embodiments of the invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for plating onto an insulating substrate, comprising the steps of:
    forming a solution comprising a monomer, an oxidant for said monomer, and a dopant;

providing in said solution a ratio of $[Fe^{+3}]/[Fe^{+2}]$ effective to maintain a solution oxidation potential within a range of 0.5 to 0.55 (V vs. SCE);

immersing said insulating substrate in said solution for a time effective to form a conducting polymer having a sheet resistivity effective for electrodeposition of a selected metal; and electrodepositing said selected metal onto each said substrate with said conducting polymer.

2. A method according to claim 1, wherein said ratio is preferably about 10.

3. A method according to claim 1 wherein the time of immersion is at least about 40 minutes.

4. A method according to claim 3 wherein the time of immersion is at least about 40 minutes.

5. A method for repetitively plating onto a succession of insulating substrates, comprising the steps of:

forming an initial solution comprising a monomer, a first oxidant for said monomer, and a dopant;

providing in said solution a ratio of $[Fe^{+3}]/[Fe^{+2}]$ effective to maintain a solution oxidation potential within a range of 0.5 to 0.55 (V vs. SCE);

immersing successive ones of said insulating substrates in said solution for a time effective to form a conducting polymer having a sheet resistivity effective for electrodeposition of a selected metal;

electrodepositing said selected metal onto each said substrate with said conducting polymer;

filtering oxidized monomer from said solution; and maintaining said solution oxidation potential within said range.

6. A method according to claim 5, further including the step of adding a second oxidant that is strong relative to said first oxidant when said conducting polymer has a sheet resistivity above a predetermined limit.

7. A method according to claim 5, wherein said second oxidant is $KMnO_4$.

8. A method according to claim 6, wherein said time of immersion is at least about 40 minutes.

9. A method for forming a conductive polymer surface on a succession of insulating substrates, comprising the steps of:

forming an initial solution comprising a monomer, a first oxidant for said monomer, and a dopant;

providing in said solution a ratio of $[Fe^{+3}]/[Fe^{+2}]$ effective to maintain a solution oxidation potential within a range of 0.5 to 0.55 (V vs. SCE);

immersing successive ones of said insulating substrates in said solution for a time effective to form a conducting polymer having a sheet resistivity within selected limits;

filtering oxidized monomer from said solution; and maintaining said solution oxidation potential within said range.

10. A method according to claim 9, further including the step of adding a second oxidant that is strong relative to said first oxidant when said conducting polymer has a sheet resistivity above a predetermined limit.

* * * * *